United States Patent
Park

(10) Patent No.: US 6,998,321 B2
(45) Date of Patent: Feb. 14, 2006

(54) METHOD FOR FORMING INDUCTOR IN SEMICONDUCTOR DEVICE

(75) Inventor: Sang Kyun Park, Yongin-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 30 days.

(21) Appl. No.: 10/878,361

(22) Filed: Jun. 29, 2004

(65) Prior Publication Data
US 2005/0142778 A1    Jun. 30, 2005

(30) Foreign Application Priority Data
Dec. 30, 2003   (KR) ...................... 10-2003-0100167

(51) Int. Cl.
*H01L 21/70*    (2006.01)
(52) U.S. Cl. ................ 438/381; 438/619; 257/531; 257/522
(58) Field of Classification Search ................ 438/300, 438/619
See application file for complete search history.

(56) References Cited

U.S. PATENT DOCUMENTS

| | | | | |
|---|---|---|---|---|
| 5,407,782 A | * | 4/1995 | Kobayashi | 430/273.1 |
| 6,284,642 B1 | * | 9/2001 | Liu et al. | 438/622 |
| 6,667,530 B1 | * | 12/2003 | Toyoda | 257/499 |
| 6,861,347 B1 | * | 3/2005 | Lee et al. | 438/622 |

* cited by examiner

*Primary Examiner*—B. William Baumeister
*Assistant Examiner*—Matthew L. Reames
(74) *Attorney, Agent, or Firm*—Mayer, Brown, Rowe & Maw LLP

(57) ABSTRACT

The present invention relates to a method for forming an inductor being a passive device in RE MEMS, RFCMOS, Bipolor/SiGe, BiCMOS semiconductor devices. According to the present method, a lower photoresist layer, an intermediate anti-exposure layer and an upper photoresist layer are sequentially formed on a substrate having a lower electrode. The upper photoresist layer is patterned by means of an exposure and development process using a first mask. The exposed intermediate anti-exposure layer is etched until the lower photoresist layer is sufficiently exposed, thus forming a partial via hole. The lower photoresist layer exposed through the upper photoresist layer and the partial via hole are patterned by means of an exposure and development process using a second mask, thus forming a damascene pattern having trenches and a via hole. The damascene pattern is filled with a conductive material layer to form a copper inductor. Not only a thickness of the trenches being line portions and a thickness of the via hole being a contact portion can be uniformly controlled, but also their height can be easily controlled. A high Q inductor can be thus manufactured.

9 Claims, 5 Drawing Sheets

METHOD FOR FORMING INDUCTOR IN SEMICONDUCTOR DEVICE

BACKGROUND

1. Field of the Invention

The present invention relates to a method for forming an inductor in a semiconductor device. More specifically, the present invention relates to a method for forming an inductor in a semiconductor device wherein a thickness at line and contact portions of the inductor being a passive device in RE MEMS, RFCMOS, Bipolor/SiGe and BiCMOS semiconductor devices is made uniform, whereby a high Q inductor can be manufactured.

2. Discussion of Related Art

In RE MEMS, RFCMOS, Bipolor/SiGe and BiCMOS semiconductor devices, an inductor being a passive device is formed by means of a damascene process and an inductor of a high quality is required as the level of integration is increased.

FIG. 1A to FIG. 1F are cross-sectional views shown to explain a conventional method for forming an inductor in a semiconductor device.

Referring to FIG. 1A, a lower electrode 11 is formed using a conductive material such as copper on a substrate 10 in which a predetermined underlying structure constituting a semiconductor device is formed. A positive photoresist layer 12 is covered on the substrate 10 including the lower electrode 11.

By reference to FIG. 1B, a primary exposure process is performed for a portion of the positive photoresist layer 12 up to the lower electrode 11 using a first mask 13, thus forming a first exposure region 12H in a portion where a contact of the inductor will be formed.

Referring to FIG. 1C, a secondary exposure process is performed for a portion of the positive photoresist layer 12 in a predetermined thickness using a first mask 14, thus forming second exposure regions 12T in portions where lines of the inductor will be formed.

By reference to FIG. 1D, the first and second exposure regions 12H and 12T are developed to form trenches 15 in which the lines of the inductor will be formed and a via hole 16 in which a contact of the inductor is to be formed.

Referring to FIG. 1E, the trenches 15 and the via hole 16 are buried with copper, thus forming an inductor 17.

By reference to FIG. 1F, the positive photoresist layer 12 is stripped to form the inductor 17 that is spaced apart from the substrate 10 by a predetermined distance.

Recently, there is a trend that devices for communications such as a RF inductor are integrated on a semiconductor device using MEMS technology. It is possible to fabricate a line width within several tens of $\mu$m in thickness. This principle is based on Faraday's Law and Lenz's Law and is characterized in that a conductor has a circular shape in which a plurality of coils are wound. One of methods for increasing efficiency of such a device is to reduce the dielectric constant between the conductor and a substrate or the conductor and a conductor. Public attention for a method for manufacturing a circuit with it exposed in the air on the top of a substrate has recently been attracted. In this method, the circuit is exposed in the air through twice-exposure process using a photoresist. The exposure process includes a shallows exposure process for forming the trenches 15 being an inductor line portion, as shown in FIG. 1C. In the shallow exposure process, the depth that the photoresist layer is developed is controlled through energy for illuminating light, thus controlling a thickness of the lines of the inductor that are finally formed. This method, however, has a difficulty in controlling a line thickness exactly and uniformly. This is because the amount of a photoresist that is developed is irregular because of various external environment such as composition of the photoresist, composition or components of a photoresist (PR) developer, a process condition used, image contrast of light illuminated, energy and so on. Accordingly, patterns are curved at the edge portions in view of the shallow exposure process, like a profile of the trenches 15 shown in FIG. 1D. This degrades reappearance in process. Accordingly, there are problems that reliability of the final inductor 17 is degraded and it is difficult to fabricate a high Q inductor, as shown in FIG. 1F.

SUMMARY OF THE INVENTION

Accordingly, the present invention has been made in view of the above problems, and it is an object of the present invention to provide a method for forming an inductor in a semiconductor device wherein a thickness at line and contact portions of the inductor is made uniform, whereby a high Q inductor can be manufactured while improving reappearance in process.

According to a preferred embodiment of the present invention, there is provided a method for forming an inductor in a semiconductor device, comprising the steps of: forming an inductor formation frame layer in which a lower photoresist layer, an intermediate anti-exposure layer and an upper photoresist layer are sequentially stacked, on a substrate in which a lower electrode is formed; patterning the upper photoresist layer by means of an exposure and development process using a first mask; etching the exposed portion of the intermediate anti-exposure layer by means of an etch process using the patterned upper photoresist layer, thus forming a partial via hole; patterning the lower photoresist layer exposed through the upper photoresist layer and the partial via hole by means of an exposure and development process using a second mask, forming trenches and a via hole; and filling the trenches and the via hole with an inductor formation material and stripping the inductor formation frame layer.

In the above, the lower photoresist layer is formed in thickness of 1 to 90 $\mu$m, the intermediate anti-exposure layer is formed 0.5 to 10 $\mu$m in thickness, and the upper photoresist layer is formed in thickness of 1 to 20 $\mu$m.

The intermediate anti-exposure layer is formed using oxide, nitride, or a conductive material having a high selective etch ratio against the inductor formation material.

The intermediate anti-exposure layer is formed using a material having at least anti-exposure function and low-temperature deposition property.

The intermediate anti-exposure layer is formed using porous oxide by means of a plasma chemical vapor deposition method at a low temperature of 250° C. or less.

If the intermediate anti-exposure layer is formed using oxide, the process of stripping the inductor formation frame layer is implemented using a diluted wet etch solution containing a HF solution or a BOE solution, a photoresist-stripping solvent, or a mixture of them.

If the intermediate anti-exposure layer is formed using oxide, the process of stripping the inductor formation frame layer comprises the steps of stripping the upper photoresist layer using a photoresist-stripping solvent or oxygen plasma; stripping the intermediate anti-exposure layer using a $H_3PO_4$ solution; and stripping the lower photoresist layer using a photoresist-stripping solvent or oxygen plasma.

The method further comprises the steps of before the lower electrode is formed, forming a metal seed layer on the substrate; and after the inductor formation frame layer is stripped, stripping the metal seed layer exposed at portions other than the lower electrode.

The metal seed layer is stripped using an acid solution such as $H_2O_2$.

DETAILED DESCRIPTION OF PREFERRED EMBODIMENTS

Figure 1A:
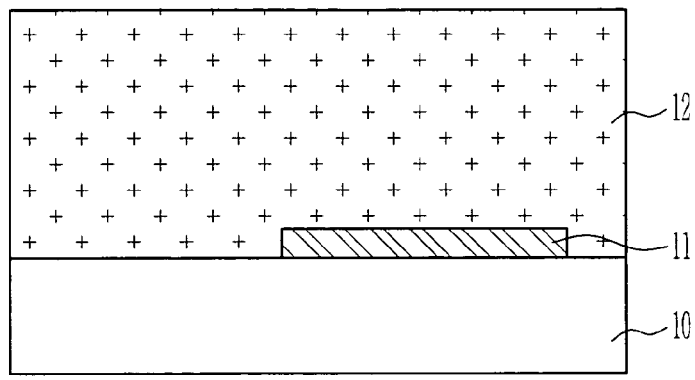
FIG. 1A to FIG. 1F are cross-sectional views shown to explain a conventional method for forming an inductor in a semiconductor device.
Figure 1B:
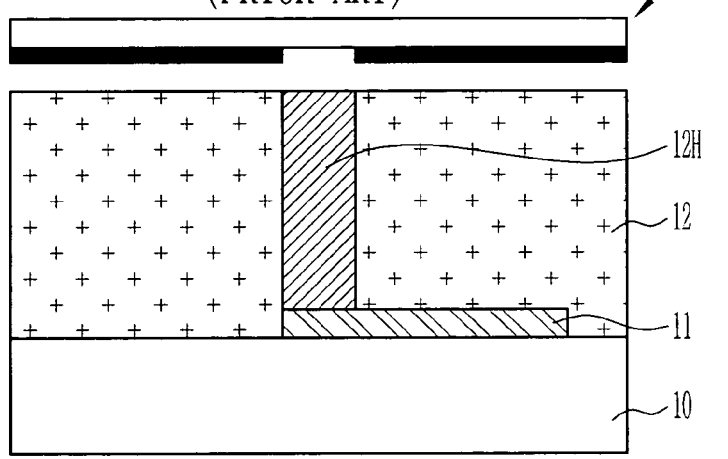
Figure 1C:
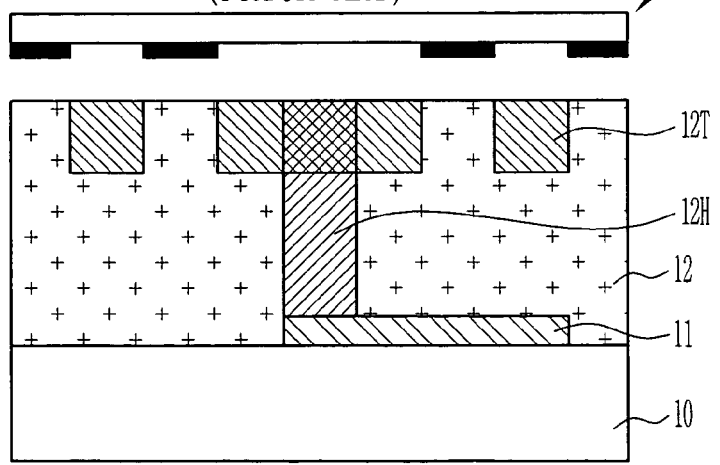
Figure 1D:
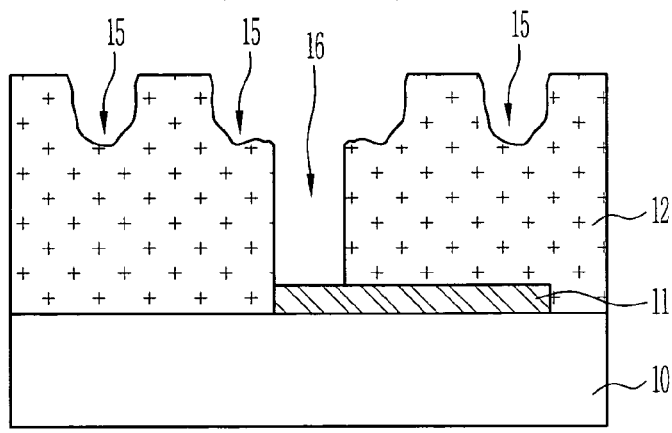
Figure 1E:
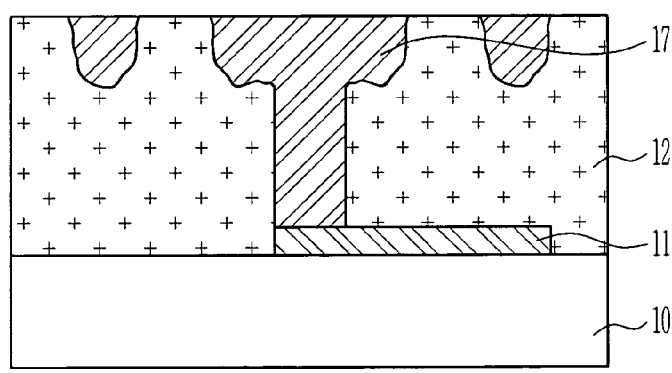
Figure 1F:
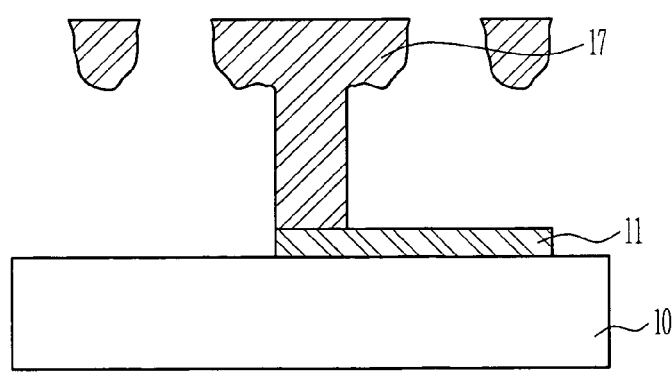

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. Or, a third film may be intervened between the one film and the other film or the semiconductor substrate. Further, in the drawing, the thickness and size of each layer are exaggerated for convenience of explanation and clarity. Like reference numerals are used to identify the same or similar parts.

FIG. 2A to FIG. 2G are cross-sectional views shown to explain a method for forming an inductor being a passive device of high frequency devices such as RE MEMS, RFCMOS, Bipolor/SiGe and BiCMOS devices according to an embodiment of the present invention.

Figure 2A:
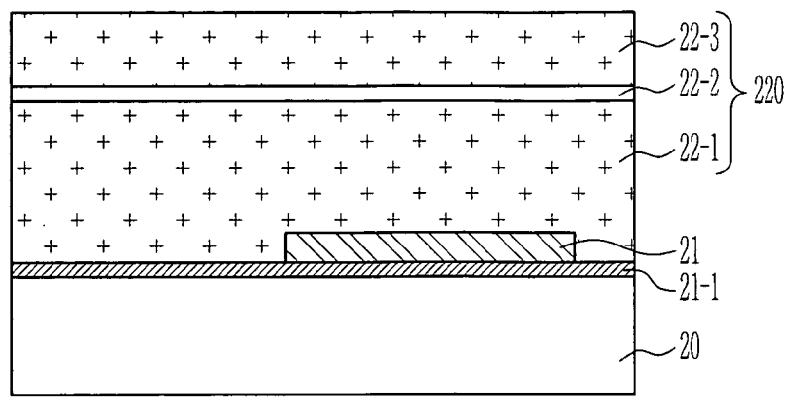
FIG. 2A to FIG. 2G are cross-sectional views shown to explain a method for forming an inductor in a semiconductor device according to an embodiment of the present invention.

Referring to FIG. 2A, a metal seed layer 21-1 is formed on a substrate 20 in which a predetermined underlying structure constituting a semiconductor device is formed. The metal seed layer 21-1 is formed using a metal material such as TiW so that a subsequent metal inductor, etc. can be selectively plated within a pattern. A lower electrode 21 is formed on a portion of the metal seed layer 21-1 using a conductive material such as copper. An inductor formation frame layer 220 in which a lower photoresist layer 22-1, an intermediate anti-exposure layer 22-2 and an upper photoresist layer 22-3 are sequentially stacked is formed on the substrate 20 including the lower electrode 21.

In the above, the lower photoresist layer 22-1 is formed in thickness of 1 to 90 μm, the intermediate anti-exposure layer 22-2 is formed 0.5 to 10 μm in thickness, and the upper photoresist layer 22-3 is formed in thickness of 1 to 20 μm.

The intermediate anti-exposure layer 22-2 can be formed using all materials having a function of preventing the lower photoresist layer 22-1 from being exposed when the upper photoresist layer 22-3 such as oxide, nitride and a conductive material is exposed. It is preferred that the intermediate anti-exposure layer 22-2 is formed using a material having not only an anti-exposure function but also an anti-reflection property so that an exposure process for the upper photoresist layer 22-3 can be easily performed. Moreover, the intermediate anti-exposure layer 22-2 should be stripped along with the photoresist layers 22-1 and 22-3 after the inductor is formed. It is thus preferred that the intermediate anti-exposure layer 22-2 is formed using a material having the selective etch ratio similar to that of the photoresist layers 22-1 and 22-3 so that the strip process can be easily performed. Furthermore, the intermediate anti-exposure layer 22-2 is experienced by a deposition process after the lower photoresist layer 22-1 is formed. It is thus preferred that the intermediate anti-exposure layer 22-2 is formed using a material that can be deposited by means of a deposition process of a low temperature, for example about 250° C. or less to the extent that the lower photoresist layer 22-1 is not hardened according to the deposition temperature. In other words, it would be best preferred that the intermediate anti-exposure layer 22-2 is formed using a material having all of the anti-exposure function, the anti-reflection property, the properties having the selective etch ratio similar to a photoresist, and the low-temperature deposition property. However, the intermediate anti-exposure layer 22-2 should be formed using a material at least having the anti-exposure function and the low-temperature deposition property. For example, a low-temperature porous oxide film that is deposited by means of a plasma CVD method at a temperature of 200° C. or less can be used as a good intermediate anti-exposure layer.

Figure 2B:
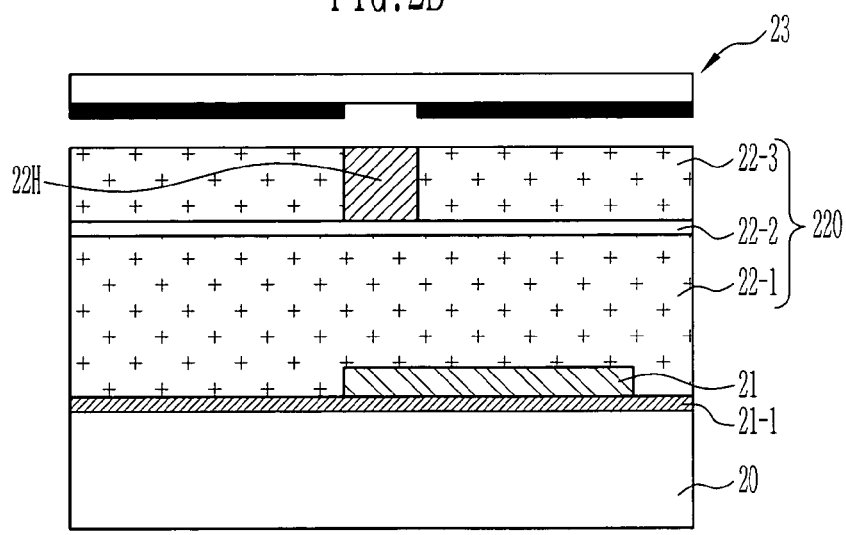

Referring to FIG. 2B, in a state where a first mask 23 having a via hole pattern is located over the upper photoresist layer 22-3, a first exposure process is performed to form a first exposure region 22H in a portion of the upper photoresist layer 22-3. At this time, the intermediate anti-exposure layer 22-2 serves to prevent the lower photoresist layer 22-1 from being exposed.

Figure 2C:
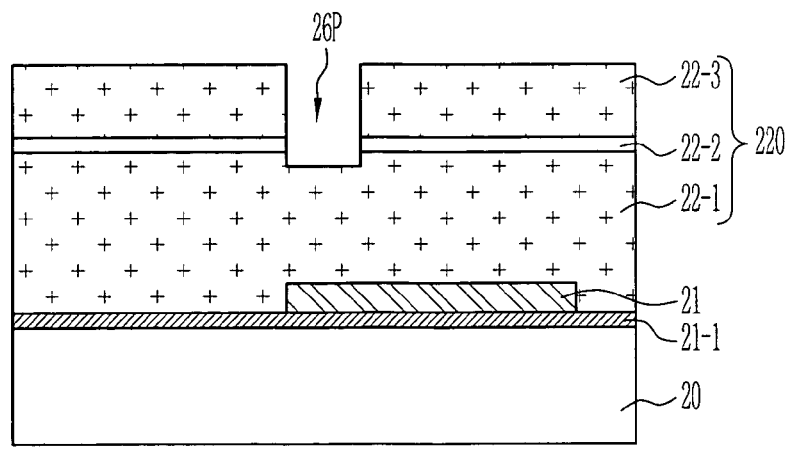

By reference to FIG. 2C, the first exposure region 22H is developed through a first development process, thus patterning the upper photoresist layer 22-3. The intermediate anti-exposure layer 22-2 is then stripped by means of an etch process using the patterned upper photoresist layer 22-3 as an etch mask so that the lower photoresist layer 22-1 is sufficiently exposed. Accordingly, the upper photoresist layer 22-3 and the intermediate anti-exposure layer 22-2 are patterned to define a partial via hole 26P.

Figure 2D:
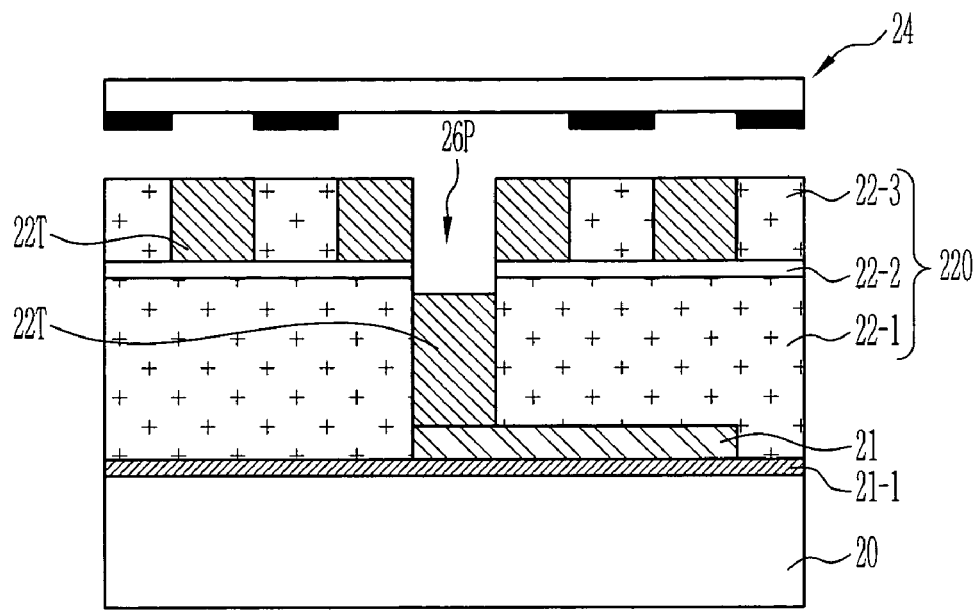

Referring to FIG. 2D, in a state where a second mask 24 having a trench pattern is located over the upper photoresist layer 22-3 in which the partial via hole 26P is formed, a second exposure process is performed to form second exposure regions 22T in some of the upper photoresist layer 22-3 that at least has the portion where the partial via hole 26P is formed and some of the lower photoresist layer 22-1 exposed through the partial via hole 26P.

Figure 2E:
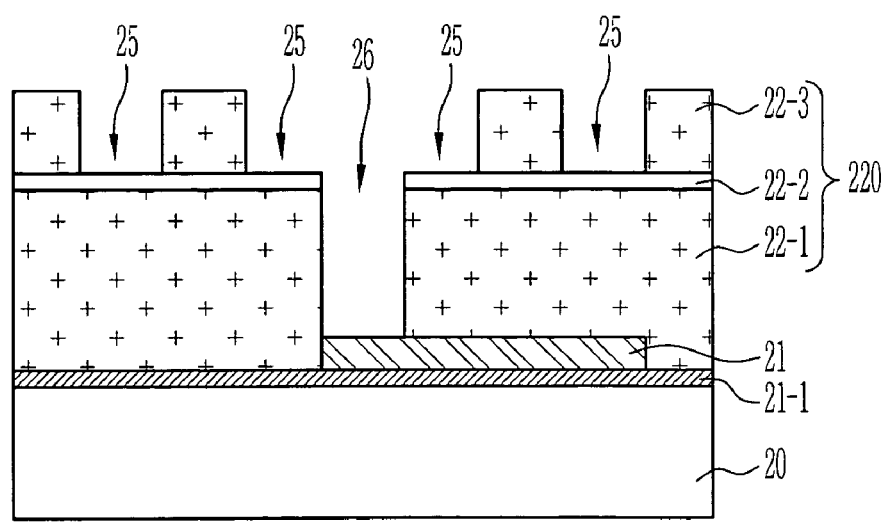

By reference to FIG. 2E, the second exposure regions 22T are developed by means of a second development process, thereby patterning the upper photoresist layer 22-3 and the lower photoresist layer 22-1. Trenches 25 in which lines of the inductor will be formed are thus formed in the upper photoresist layer 22-3. Also, a via hole 26 connected to the trenches 25 and in which a contact of the inductor will be formed is formed in the lower photoresist layer 22-1.

Figure 2F:
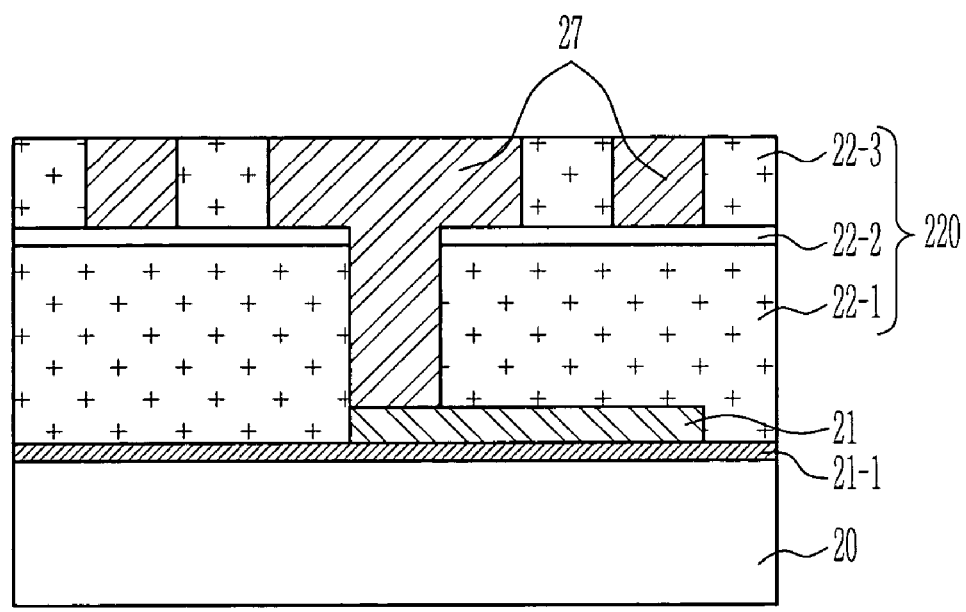

Referring to FIG. 2F, a damascene pattern having the trenches 25 and the via hole 26 is buried with a material for forming an inductor, for example copper, aluminum, tungsten, etc. which is applied to semiconductor devices, through various common deposition or plating processes, and is then polished by means of a CMP process, etc., thereby forming an inductor 27. At this time, the inductor 27 can be formed by a method for forming the inductor selectively only within the inductor pattern using the seed layer 21-1. In this case, the inductor 27 is formed without a subsequent CMP process.

Figure 2G:
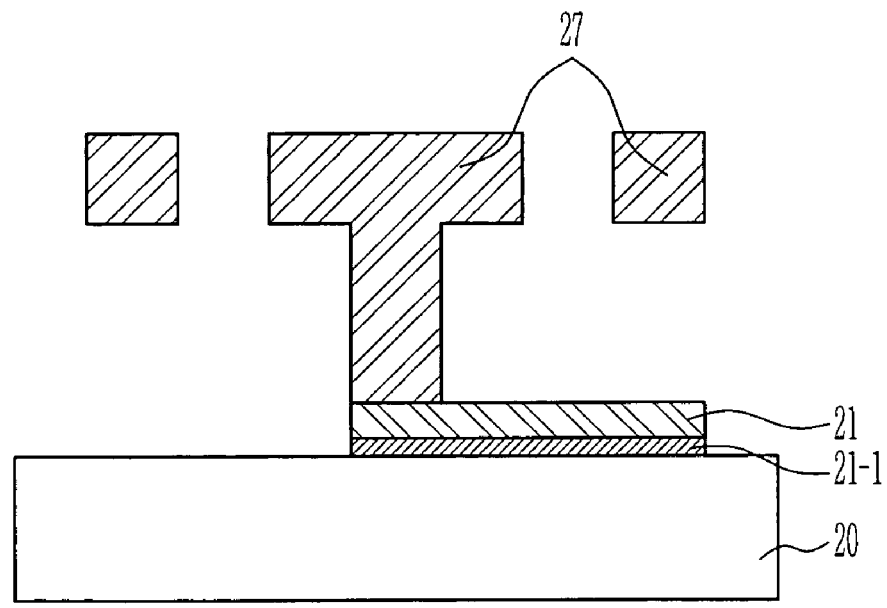

By reference to FIG. 2G, the inductor formation frame layer 220, which consists of the lower photoresist layer 22-1, the intermediate anti-exposure layer 22-2 and the upper photoresist layer 22-3, is stripped and the seed layer 21-1 exposed at portions other than the lower electrode 21 is stripped, thereby completing an air-suspended inductor 27.

In the above, the process of stripping the inductor formation frame layer 220 may vary depending on which material is the intermediate anti-exposure layer 22-1 formed. If the intermediate anti-exposure layer 22-1 is made of oxide, the three layers 22-1, 22-2 and 22-3 are all stripped at once using a diluted wet etch solution containing a HF solution or a BOE solution, a photoresist-stripping solvent, or a mixture of them. If the intermediate anti-exposure layer 22-1 is made of nitride, the upper photoresist layer 22-3 is stripped using a photoresist-stripping solvent or oxygen plasma, the intermediate anti-exposure layer 22-2 made of nitride is then stripped using a $H_3PO_4$ solution, and the lower photoresist layer 22-1 is finally stripped by means of a method similar to that used in the upper photoresist layer 22-3. If the intermediate anti-exposure layer 22-1 is made of other material, the layers are stripped using an etchant suitable for the material. The seed layer 21-1 can be stripped in an acid solution such as $H_2O_2$ if it is formed using TiW, or can be stripped using a proper etchant if it is formed using a metal material.

According to the present invention described above, a thickness of trenches being line portions and a thickness of a via hole being a contact portion in an inductor being a passive device in RE MEMS, RFCMOS, Bipolor/SiGe and BiCMOS semiconductor devices can be controlled uniformly. It is thus possible not only to improve reappearance in process but also to manufacture a high Q inductor having a height of several to several tens of $\mu$m in a uniform thickness. Therefore, the present invention has effects that it can improve reliability of devices and realize higher integration of devices.

What is claimed is:

1. A method for forming an inductor in a semiconductor device, comprising the steps of:

forming an inductor formation frame layer in which a lower photoresist layer, an intermediate anti-exposure layer and an upper photoresist layer are sequentially stacked, on a substrate in which a lower electrode is formed;

patterning the upper photoresist layer by means of an exposure and development process using a first mask;

etching the exposed portion of the intermediate anti-exposure layer by means of an etch process using the patterned upper photoresist layer, thus forming a partial via hole;

patterning the lower photoresist layer exposed through the upper photoresist layer and the partial via hole by means of an exposure and development process using a second mask, thereby forming trenches and a via hole; and filling the trenches and the via hole with an inductor formation material and then stripping the inductor formation frame layer.

2. The method as claimed in claim 1, wherein the lower photoresist layer is formed in thickness of 1 to 90 $\mu$m, the intermediate anti-exposure layer is formed 0.5 to 10 $\mu$m in thickness, and the upper photoresist layer is formed in thickness of 1 to 20 $\mu$m.

3. The method as claimed in claim 1, wherein the intermediate anti-exposure layer is formed using oxide, nitride, or a conductive material having a high selective etch ratio against the inductor formation material.

4. The method as claimed in claim 1, wherein the intermediate anti-exposure layer is formed using a material having at least anti-exposure function and low-temperature deposition property.

5. The method as claimed in claim 1, wherein the intermediate anti-exposure layer is formed using porous oxide by means of a plasma chemical vapor deposition method at a low temperature of 250° C. or less.

6. The method as claimed in claim 1, wherein if the intermediate anti-exposure layer is formed using oxide, the process of stripping the inductor formation frame layer is implemented using a diluted wet etch solution containing a HF solution or a BOE solution, a photoresist-stripping solvent, or a mixture of them.

7. The method as claimed in claim 1, wherein if the intermediate anti-exposure layer is formed using oxide, the process of stripping the inductor formation frame layer comprises the steps of:

stripping the upper photoresist layer using a photoresist-stripping solvent or oxygen plasma;

stripping the intermediate anti-exposure layer using a $H_3PO_4$ solution; and stripping the lower photoresist layer using a photoresist-stripping solvent or oxygen plasma.

8. The method as claimed in claim 1, further comprising the steps of:

before the lower electrode is formed, forming a metal seed layer on the substrate; and after the inductor formation frame layer is stripped, stripping the metal seed layer exposed at portions other than the lower electrode.

9. The method as claimed in claim 8, wherein the metal seed layer is stripped using an acid solution such as $H_2O_2$.

* * * * *